(12) United States Patent
Wang et al.

(10) Patent No.: US 9,887,213 B2
(45) Date of Patent: Feb. 6, 2018

(54) METHOD FOR MANUFACTURING THIN FILM TRANSISTOR AND RELATED ACTIVE LAYER FOR THIN FILM TRANSISTOR, THIN FILM TRANSISTOR, ARRAY SUBSTRATE, AND DISPLAY APPARATUS

(71) Applicant: BOE TECHNOLOGY GROUP CO., LTD, Beijing (CN)

(72) Inventors: Zuqiang Wang, Beijing (CN); Chien Hung Liu, Beijing (CN); Yu Cheng Chan, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/125,786

(22) PCT Filed: Aug. 14, 2015

(86) PCT No.: PCT/CN2015/087016
§ 371 (c)(1),
(2) Date: Sep. 13, 2016

(87) PCT Pub. No.: WO2016/101632
PCT Pub. Date: Jun. 30, 2016

(65) Prior Publication Data
US 2017/0005115 A1    Jan. 5, 2017

(30) Foreign Application Priority Data
Dec. 23, 2014 (CN) .......................... 2014 1 0815652

(51) Int. Cl.
*H01L 21/02* (2006.01)
*H01L 27/12* (2006.01)
(Continued)

(52) U.S. Cl.
CPC .... *H01L 27/1222* (2013.01); *H01L 21/02675* (2013.01); *H01L 27/1281* (2013.01); *H01L 29/66757* (2013.01); *H01L 29/78675* (2013.01)

(58) Field of Classification Search
CPC ....... H01L 29/66; H01L 29/78; H01L 29/786; H01L 21/00; H01L 21/20; H01L 21/36; H01L 21/02; H01L 21/02675; H01L 21/84
(Continued)

(56) References Cited

U.S. PATENT DOCUMENTS

2006/0088986 A1* 4/2006 Lin .................... H01L 21/2026
438/482
2007/0054473 A1 3/2007 Lin et al.

FOREIGN PATENT DOCUMENTS

CN  1722467 A  1/2006
CN  1770397 A  5/2006
(Continued)

OTHER PUBLICATIONS

The World Intellectual Property Organization (WIPO) International Search Report for PCT/CN2015/087016 dated Oct. 29, 2015 p. 1-4.
(Continued)

*Primary Examiner* — Chuong A Luu
(74) *Attorney, Agent, or Firm* — Anova Law Group, PLLC

(57) ABSTRACT

The present disclosure provides a method for forming an active layer with a pattern. The method includes forming an amorphous silicon layer and forming a function layer on the amorphous silicon layer. The function layer has a same pattern as the active layer. The method further includes performing a crystallization process for converting the amorphous silicon layer to a poly-silicon layer. The poly-
(Continued)

silicon layer has first portions covered by the function layer and second portions not covered by the function layer, and grain sizes of the poly-silicon in the first portions are larger than grain sizes of the poly-silicon in the second portions.

12 Claims, 3 Drawing Sheets

(51) Int. Cl.
    *H01L 29/66*     (2006.01)
    *H01L 29/786*     (2006.01)

(58) Field of Classification Search
    USPC .......................................................... 257/72
    See application file for complete search history.

(56) References Cited

FOREIGN PATENT DOCUMENTS

| | | |
|---|---|---|
| CN | 1933104 A | 3/2007 |
| CN | 101038935 A | 9/2007 |
| CN | 101114595 A | 1/2008 |
| CN | 104505404 A | 4/2015 |

OTHER PUBLICATIONS

State Intellectual Property Office of the P.R.C (SIPO) Office Action 2 for 201410815652.0 dated Jul. 27, 2017 5 Pages (including translation).

* cited by examiner

METHOD FOR MANUFACTURING THIN FILM TRANSISTOR AND RELATED ACTIVE LAYER FOR THIN FILM TRANSISTOR, THIN FILM TRANSISTOR, ARRAY SUBSTRATE, AND DISPLAY APPARATUS

CROSS-REFERENCES TO RELATED APPLICATIONS

This PCT patent application is a national phase entry under 35 U.S.C. § 371 of International Application No. PCT/CN2015/087016, filed on Aug. 14, 2015, which claims priority of Chinese Patent Application No. 201410815652.0, filed on Dec. 23, 2014. The above enumerated patent applications are incorporated by reference herein in their entirety.

FIELD OF THE INVENTION

The present invention generally relates to the display technologies and, more particularly, relates to a TFT (Thin Film Transistor), a method for manufacturing an active layer for the TFT, an TFT, an array substrate, and a displaying apparatus containing the same.

BACKGROUND

With the improvement in general living standards, there has been an increasing demand for higher display quality. Meanwhile, as display technology advances, flat panel display has become widely used in everyday life. Currently, the technology to manufacture LCD (liquid-crystal display) devices has become considerably more mature, and LCD display has been widely used in devices with display functions, such as mobile phones, cameras, laptops, TVs, etc.

The great demand for devices with display functions further promotes the development of display technology. New methods and materials used for display technology, e.g., low-temperature poly-silicon and organic display, continue to emerge. For example, AMOLED (Active-Matrix Organic Light-Emitting Diode) display is referred as the next-generation display technology for its great advantages in display quality, performance, and cost over conventional LCDs. Thus, AMOLED display has gained significant attention from display manufacturers all over the world.

AMLCD (Active-Matrix Liquid-Crystal Display) and AMOLED may both use TFTs (Thin Film Transistors) as control elements. Conventional TFTs may be made of a-Si (amorphous silicon), p-Si (poly-silicon), oxide semiconductors, and/or organic thin film transistors. Compared to conventional a-Si, LTPS (Low-Temperature Poly-Silicon) may have more advantages. Thus, LTPS may be considered as an ideal technology for forming AMLCD array substrates and AMOLED array substrates.

Currently, a TFT often includes at least a gate, a source, a drain, and an active layer configured for forming a conductive channel. To manufacture LTPS TFT array substrates using a conventional manufacturing process, the a-Si layer often undergoes a crystallization process through an ELA (Excimer Laser Annealing) process when the active layer is being formed. The grain size of the p-Si, formed from the a-Si after the annealing, may be dependent on the ELA device and the adjustable process window of the device may be limited. However, the p-Si formed through the method described above may have relatively small grain size and an undesirably large amount of grain boundaries. As a result, the p-Si may have undesirably high edge effects in the channel. The formed TFTs may have undesirably high leakage currents.

BRIEF SUMMARY OF THE DISCLOSURE

The present invention addresses the above problems in the prior art. The present disclosure provides a TFT and a method for manufacturing the TFT. The present disclosure further provides an array substrate and a display apparatus. The TFT produced through the manufacturing method of the present disclosure has few boundaries in the channel, high carrier mobility, and low leakage current. The TFTs of the present disclosure may therefore have improved electrical properties.

One aspect of the present disclosure provides a method for forming an active layer with a pattern. The method includes forming an amorphous silicon layer and forming a function layer on the amorphous silicon layer. The function layer includes the pattern of the active layer. The method further includes performing a crystallization process for converting the amorphous silicon layer to a poly-silicon layer. The poly-silicon layer has first portions covered by the function layer and second portions not covered by the function layer, and grain sizes of the poly-silicon in the first portions are larger than grain sizes of the poly-silicon in the second portions.

Optionally, the function layer is made of a non-metal material including silicon oxide, silicon nitride, or a combination of silicon oxide and silicon nitride.

Optionally, a thickness of the function layer is about 5 to 20 nm.

Optionally, the disclosed method further includes applying a mask for patterning the active layer and patterning the function film to form the function layer with the same pattern as the active layer.

Optionally, the crystallizing process includes applying an excimer laser annealing process.

Optionally, the method further includes forming a buffer layer on a substrate, wherein the buffer layer is made of silicon oxide, silicon nitride, or a combination of silicon oxide and silicon nitride.

Optionally, the substrate is made of glass.

Optionally, the amorphous silicon layer and the function layer are formed consecutively by plasma enhanced chemical vapor deposition.

Optionally, the heat retaining duration for the first portions of the amorphous silicon layer covered by the function layer is longer than or equal to 35 ns.

Optionally, the grain sizes of the poly-silicon formed in the first portions covered by the function layer are about 0.3 to 0.5 μm.

Optionally, the steps for forming the active layer further include removing the function layer after crystallizing the amorphous silicon layer and before patterning the poly-silicon layer.

Optionally, removing the function layer includes applying an etching process to remove the function layer.

Another aspect of the present disclosure provides a thin-film transistor. The thin-film transistor includes a substrate, a gate, a source, a drain, and an active layer, wherein the active layer is formed by forming an amorphous silicon layer; forming a function layer on the amorphous silicon layer, wherein the function layer has a same pattern as the active layer; and performing a crystallizing process for converting the amorphous silicon layer to a poly-silicon layer, wherein the poly-silicon layer has first portions covered by the function layer and second portions not covered by the function layer, and grain sizes of the poly-silicon in the first portions are larger than grain sizes of the poly-silicon in the second portions.

Optionally, the thin-film transistor is a top-gate type thin-film transistor.

Optionally, the function layer is formed on the active layer.

Another aspect of the present disclosure provides a thin-film transistor, including a substrate, a gate, a source, a drain, an active layer, and a function layer, wherein the active layer is formed on the substrate; the function layer is formed on the active layer and has a same pattern as the active layer; and the drain and the source are electrically connected to the active layer.

Optionally, the drain and the source are electrically connected to the active layer through via-holes.

Another aspect of the present disclosure provides an array substrate, including the thin-film transistor provided by the present disclosure.

Another aspect of the present disclosure provides a display apparatus, including the array substrate provided by the present disclosure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
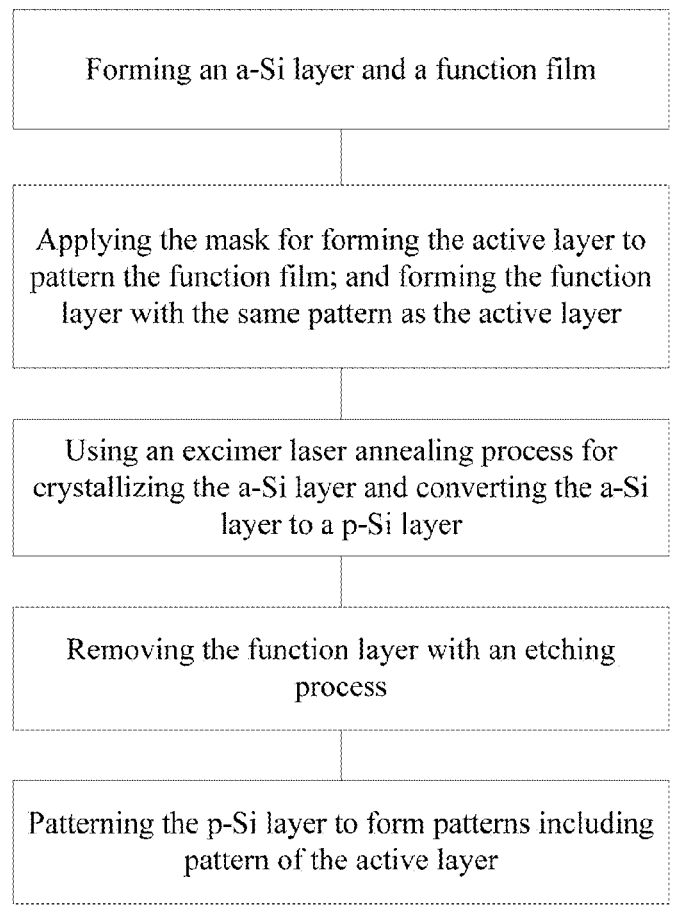
FIG. 1 illustrates an exemplary fabrication process for forming the active layer in the TFT according to the disclosed embodiments.

For those skilled in the art to better understand the technical solution of the invention, reference will now be made in detail to exemplary embodiments of the invention, which are illustrated in the accompanying drawings. Wherever possible, the same reference numbers will be used throughout the drawings to refer to the same or like parts.

In the formation process of a conventional active layer, an important factor causing the formation of p-Si of relatively small grain sizes is described as follows. When the a-Si is being converted to p-Si, the heat retaining duration may be dependent on the laser scanning speed of the ELA process. Due to the limited adjustable process window, the heat retaining duration may be short (e.g., about 30 ns). The short heat retaining duration may have an adverse effect on the formation of p-Si of larger grain sizes. As a result, defects, e.g., a relatively large amount of boundaries or grain boundaries, may be formed in the channel and grain boundaries may be a main reason for causing leakage currents. However, by changing the scanning duration (e.g., adjusting the scanning speed), the corresponding change in the heat retaining duration (i.e., crystallization time) is insubstantial. For example, the scanning duration may be increased by only a few nanoseconds after the reducing the scanning speed. Meanwhile, reducing the scanning speed may cause the production/manufacturing cycle (e.g., time required for manufacturing the device) to be longer, and undesirably reduce/compromise production efficiency. Thus, the technical solution provided by the present disclosure may extend the heat duration and increase the grain size of the p-Si to reduce the leakage currents without requiring additional masks or compromising the production efficiency in the manufacturing process.

One aspect of the present disclosure provides an active layer for TFT and a method for manufacturing the active layer.

The disclosed method for forming a TFT with the active layer includes steps for forming the gate, the source, the drain, and the active layer. The step to form the active layer may include a crystallization process to convert a-Si to p-Si. Before the crystallization process, a function layer may be formed on the a-Si layer. The function layer may have the same pattern as the active layer. During the crystallization process, the heat retaining duration and pressure in the portions of the a-Si layer defined by the pattern of the function layer may be different from the heat retaining duration and pressure in the portions of the a-Si layer not defined by the pattern of the function layer. The portions of the a-Si layer defined by the pattern of the function layer may represent the portions of the a-Si layer under or corresponding to the pattern of the function layer, and the portions of the a-Si layer not defined by the pattern of the function layer may represent the portions of the a-Si layer not under nor corresponding to the pattern of the function layer.

Thus, in the p-Si layer converted from the a-Si layer, the p-Si corresponding to the pattern of the function layer may have larger grain sizes compared to the p-Si not corresponding to the pattern of the function layer. That is, using the disclosed method, forming an additional function layer may have the same effect as increasing the laser scanning duration of the ELA. Meanwhile, with the function layer, the crystallization process can be less affected by the energy fluctuation (i.e., energy non-uniformity) when the ELA laser beam is scanning the a-Si layer and the function layer. Mura defects caused by laser scanning non-uniformity may thus be reduced with the function layer. Further, the overlapping scan regions may be smaller and the scanning may be faster. The heat retaining duration for the crystallization process can thus be improved. As a result, the performance of the manufactured TFT can be improved.

It may be required that the material for forming the function layer is not capable of ion diffusion to ensure the a-Si is not contaminated by the function layer. Meanwhile, the material for forming the function layer may be easy to remove without leaving any residue on the p-Si layer. Preferably in one embodiment, the material for forming the function layer may be a non-metal material, including $SiO_2$ (silicon dioxide) and/or $SiN_x$ (silicon nitride).

It has been found that, the thickness of the function layer and the temperature of the ELA during the crystallization process may have significant effects on the grain size of the p-Si function layer. In one embodiment, the thickness of the function layer may be about 5 to about 20 nm. When the thickness of the function layer is within the range of 5 to 20 nm, the grain size of the formed p-Si can be larger. For example, when the thickness of the function layer is about 5 to 10 nm, the grain sizes of the formed p-Si can be about 0.3 to about 0.5 μm.

In the present disclosure, the patterning process may only include a photolithography process, or may include a photolithography process and appropriate etching steps. The patterning process may also include printing, inkjet printing, and/or other suitable processes for forming patterns. The photolithography process may refer to steps including film formation, development, and/or exposure. The photolithography process may include use of photoresist, masks, and/or suitable exposure apparatus for the steps described above in the photolithography process. The patterning process for the present disclosure can be designed based on the structures to be formed in the present disclosure.

As shown in FIG. 1, the steps for forming the active layer may include steps S1 to S5.

In step S1, an a-Si layer and a function film can be formed.

In step S2, a mask for forming the pattern of the active layer can be applied on the function film to form a function layer. The function layer may have the same pattern as the active layer.

In step S3, the a-Si layer can be crystallized and converted to a p-Si layer. An ELA process can be used to crystallize the a-Si layer and convert the a-Si layer to the p-Si layer.

In step S4, the function layer can be removed by an etching process.

In step S5, the p-Si layer can be patterned through a patterning process. The pattern of the p-Si layer may include the pattern of the active layer.

In certain embodiments of the present disclosure, the function layer may not be removed. That is, the function layer may remain on the p-Si layer (i.e., the active layer). The function layer and the p-Si layer may include the pattern of the p-Si layer can be patterned through a suitable patterning process such as photolithography.

In one embodiment, the pattern of the p-Si may be the same as the pattern of the function layer.

To form a TFT with a complete structure, the fabrication process of the TFT also includes forming a gate, a source, and/or a drain. The method for fabricating the TFTs provided by the present disclosure may be used for forming top-gate type TFTs and bottom-gate type TFTs. The source and the drain may be formed in the same layer or in different layers. Specifically, the method disclosed can be used to form TFTs each with the gate formed between the active layer and the source, where the drain may be in the same layer or a different layer as the source. The method disclosed can also be used to form TFTs with the active layer between the gate and the source, where the drain may be in the same layer or a different layer as the source. The structure of the TFTs formed is not limited by the embodiments of the present disclosure. A top-gate type TFT or a bottom-gate type TFT may be defined by the positions of the gate and the gate dielectric layer. For example, for a TFT with the gate closer to the substrate and the gate dielectric layer farther away from the substrate, the TFT may be referred as a bottom-gate type TFT. For a TFT with the gate farther away from the substrate and the gate dielectric layer closer to the substrate, the TFT may be referred as a top-gate type TFT.

In various embodiments of the present disclosure, the TFT may be a top-gate type TFT or a bottom-gate type TFT. In one embodiment, the TFT may be a top-gate type TFT.

Figure 2A:
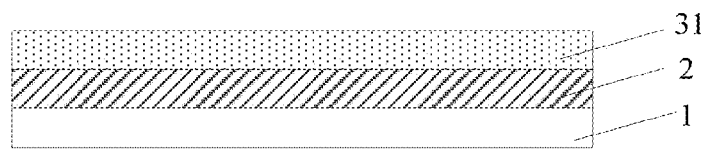
FIGS. 2A-2E illustrate cross-section views of exemplary TFTs with the active layer corresponding to certain stages of an exemplary fabrication process according to various disclosed embodiments.

The process to form the active layer directly on the substrate is illustrated below. First, the substrate 1 can be cleaned. As a shown in FIG. 2A, a PECVD (Plasma Enhanced Chemical Vapor Deposition) process can be used to form a buffer layer 2 on the substrate 1 and an a-Si layer 31 on the buffer layer 2. The substrate 1 can be made of any suitable transparent material such as glass. The buffer layer 2 may be made of silicon oxide $SiO_x$ and/or silicon nitride $SiN_x$. The buffer layer 2 can be a single-layered structure or a multiple-layered structure. The thickness of the $SiO_x$ layer may be about 50 to about 100 nm, and the thickness of the $SiN_x$ layer may be about 100 to about 300 nm. The thickness of the a-Si layer 31 may be about 40 to about 50 nm. Further, the substrate 1 can be placed in a furnace for a dehydrogenation process to reduce the H content in the a-Si layer 31. Often, the H content is controlled below about 2%.

Further, a function film can be formed on the a-Si layer 31. The function film can be made of a non-metal material. Preferably, the function film can be made of $SiO_2$ and/or $SiN_x$, and so on. The method for forming the function film should not be limited to the embodiments of the present disclosure. Preferably, the function film can be formed through a PECVD process. Also, the function film can be formed consecutively after the formation of the a-Si layer through the PECVD process to reduce tact time between the formation of the a-Si layer and the formation of the function film.

Figure 2B:
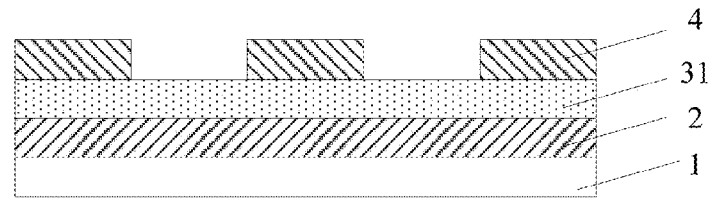

Further, as shown in FIG. 2B, the mask for patterning the active layer, i.e., the active mask, can be used for patterning the function film to form the function layer 4. The function layer 4 may have the same pattern as the active layer. In one embodiment, by using the existing active mask to define the pattern of the function layer 4, the function layer 4 can ensure certain portions of the a-Si layer, i.e., the portions of the a-Si layer defined by the pattern of the function layer and corresponding to the active layer to be formed, to be heated for a sufficiently longer period without adding any additional masks. That is, the heat retaining duration for the certain portions of the a-Si layer can be longer. For example, under the same manufacturing conditions, the heat retaining duration for the portions of the a-Si layer without the function layer 4 may be about 30 ns, and the heat retaining duration for the certain portions of the a-Si layer with the function layer 4 can be longer than 35 ns. The longer heat retaining duration can enable the formation of p-Si layer with larger grain sizes. For example, when the thickness of the function layer 4 is about 5 to 10 nm, the grain size of the p-Si to be formed can be about 0.3 μm to 0.5 μm. Without the function layer 4, the grain sizes of the p-Si to be formed may be about 0.2 μm to 0.3 μm. The electrical properties of the TFTs can be effectively improved by the larger grain sizes.

Figure 2C:
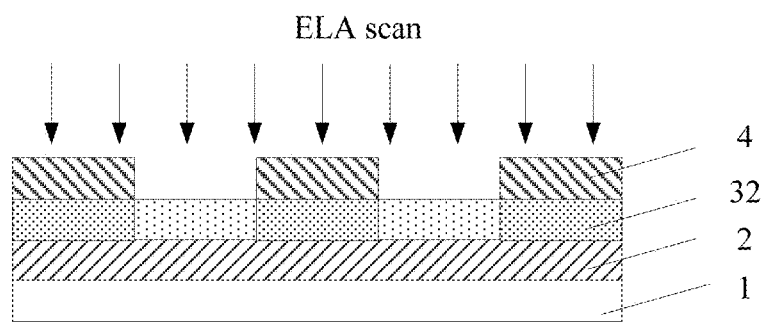

Further, an ELA scan may be used to convert the a-Si to p-Si (i.e., the crystallization process). As shown in FIG. 2C, the a-Si layer 31 can be converted to a p-Si layer 32 through the ELA scan. In the crystallization process, the function layer 4 can buffer heat dissipation in the a-Si layer, i.e., slowing down or delaying the heat dissipation in the a-Si layer, such that the temperature of the a-Si layer can be maintained for a sufficiently long time after the a-Si is melted. The sufficiently long time can enable the a-Si to convert to p-Si with larger grain sizes. Meanwhile, because the stress in the portions of the a-Si layer defined by the pattern of the function layer is different from the stress in the portions of the a-Si not defined by the pattern of the function layer, the p-Si may grow along the direction of the corresponding channel. The channel may refer to the passage in which the carriers move between the source and drain in a TFT. The p-Si layer thus may have less grain boundaries and the channel may have fewer boundaries within. Therefore, lower leakage current may be generated when the TFT is operated under reverse bias.

Figure 2D:
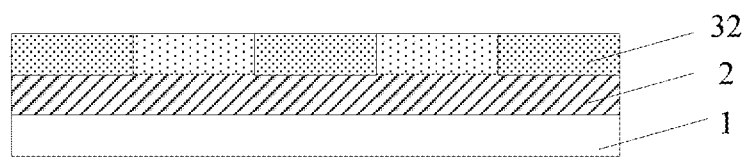

Further, as shown in FIG. 2D, the function layer 4 can be removed through an etching process.

Figure 2E:
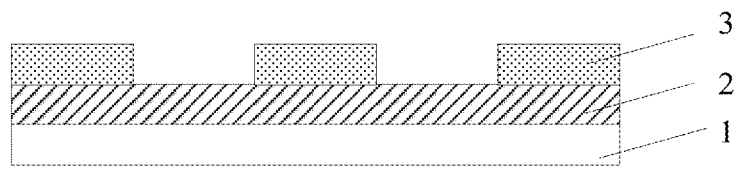

Furthermore, as shown in FIG. 2E, the active mask can be applied on the p-Si layer 32 to pattern the p-Si layer 32 for forming the active layer 3.

Based on the formation of the active layer 3, other structures such as gates (including gate lines), sources (including data lines), and drains can be formed according to manufacturing requirements. Structures such as passivation layers, pixel electrodes, and/or anodes of OLEDs (Organic Light-Emitting Diodes) can also be formed. Details of the formation processes are omitted herein.

In certain other embodiments of the present disclosure, the function layer 4 may not be removed. That is, the function layer 4, patterned, may be kept on portions of the p-Si layer 32 after the crystallization process. Since the pattern of the function layer 4 may be the same as the pattern of the active layer 3, after the p-Si layer 32 is patterned to form the active layer 3, the function layer 4 may still be kept on the active layer 3 (not shown).

In the method for manufacturing the TFT provided in the present embodiments, forming the function layer on the a-Si layer can effectively prevent the a-Si from being exposed and oxidized in the surrounding environment. The uniformity of the crystallization process can be improved and the crystallization process can be better controlled. Further, the function layer can prevent fast heat dissipation in the a-Si/p-Si layer during the crystallization process. The a-Si/p-Si layer may refer to the layer made of a-Si, p-Si, and/or the mixture of both in the crystallization process. That is, the function layer can enable first portions of the a-Si/p-Si layer to have a different temperature from second portions of the a-Si/p-Si layer. That is, the first portions of the a-Si/p-Si may be covered by the function layer and the second portions of the a-Si/p-Si may not be covered by the function layer, or vice versa. The different temperatures can enable the formation of p-Si with larger grain sizes.

Meanwhile, since the stress in the first portions of the a-Si/p-Si layer is different from the stress in the second portions of the a-Si/p-Si layer (i.e., the stress in the a-Si/p-Si portion covered/defined by the function layer is different from the stress in the a-Si/p-Si portion not covered by the function layer), the p-Si may grow along the direction of the corresponding channel. The crystallized p-Si grains covered by the function layer may grow in accordance with the pattern of the function layer. Thus, p-Si with larger grain sizes can be formed and boundaries within the channels can be reduced. Edge effect in the channel can be effectively reduced. Carrier mobility of the TFTs with the disclosed active layer can be improved and leakage current can be greatly reduced. The electrical properties of the TFTs can thus be effectively improved.

By using the method disclosed, LTPS TFTs with high stability can be produced. The method provided by the disclosed embodiments may be particularly suitable for forming array substrates for AMLCDs and AMOLEDs.

By using the method disclosed, a TFT can be produced. Since the active layer of the TFT is made of p-Si with large grain sizes and fewer grain boundaries, the TFT may have fewer inner boundaries in the channel. The TFT may have higher carrier mobility, lower leakage currents, and improved electrical properties.

Another aspect of the present disclosure provides a TFT device.

Figure 3:
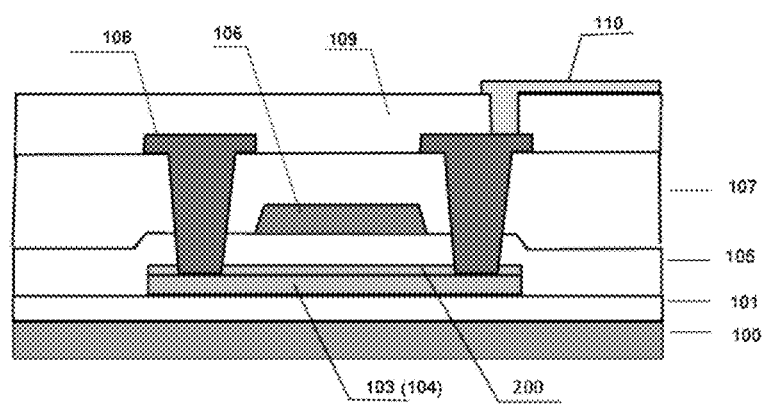
FIG. 3 illustrates cross-section view of an exemplary TFT according to the disclosed embodiments.

FIG. 3 illustrates a cross-section view of the TFT device provided by the present disclosure. In the TFT device, the function layer is kept on the p-Si layer after the crystallization process. As shown in FIG. 3, the TFT device may include a substrate 100, a buffer layer 101, a p-Si layer 103, a function layer 200, a gate insulating layer 105, and a gate 106. The TFT device may also include an interlayer insulating layer 107, electrodes of source and drain 108, a planarization layer 109, and a pixel electrode layer 110.

In one embodiment, the buffer layer 101 may be formed on the substrate 100, and an a-Si layer 102 (not shown), corresponding to the subsequently-converted p-Si layer, may be formed on the buffer layer 101. A function film may be formed on the a-Si layer 102 and patterned by a first patterning process to form a function layer 200. An ELA scan may be performed and portions of the a-Si layer 102 covered by the function layer 103 may be converted to p-Si through a crystallization process. Portions of the a-Si layer 102 not converted to p-Si may be removed and the p-Si remained may form the p-Si layer 103. The p-Si layer 103, having a same pattern as the function layer 200, may be the active layer 104.

Further, the gate insulating layer 105 may be formed to cover the patterned function layer 200 and active layer 104. A second patterning process may be performed on the gate insulating layer 105 and the gate 106 may be formed on the gate insulating layer 105. The interlayer insulating layer 107 may be formed to cover the gate 106 and the gate insulating layer 105. A third patterning process may be performed to form electrode through holes in the interlayer insulating layer 107, the gate insulating layer 105, and the function layer 200 at positions corresponding to the source and drain of the subsequently-formed TFT device. The electrode through holes may expose the source and drain of the subsequently-formed TFT device. Suitable metal such as copper may be used to fill up the electrode through holes and form a metal layer on the interlayer insulating layer 107. The metal layer may be patterned through a fourth patterning process to form electrodes of the source and drain 108 of the TFT device. The electrodes of the source and drain 108 may be formed on both sides of the gate 106 and provide electrical connection between the source/drain of the TFT device and other electrical connections such as a subsequently-formed pixel electrode. The source and train 108 may be electrically connected to the active layer 104 through via-holes (not shown), and the via-holes are filled with suitable metal, such as copper, to form vias.

Further, the planarization layer 109 is formed to cover the electrodes of the source and drain 108 and the interlayer insulating layer 107. A fifth patterning process may be performed to form a second through hole in the planarization layer and expose the surface of one of the electrodes of the source and drain 108. Suitable material such as ITO (indium tin oxide) may be formed to fill up the second through hole and form a pixel electrode layer on the planarization layer 109. A sixth patterning process may be performed to pattern the pixel electrode layer and form the pixel electrode 110. The pixel electrode 110 may provide electrical connection between the electrode of the source/drain 108 and the corresponding pixel (not shown).

The first patterning process, the second patterning process, the third patterning process, the fourth patterning process, the fifth patterning process, and the sixth patterning process may each be any suitable patterning process such as a photolithography process. The process to deposit the metal of the electrodes of the source and drain 108 may be any suitable deposition process such as an electroplating process. The process to deposit the ITO pixel electrode 104 may include any suitable deposition process such as an evaporation or a spin-on process.

The substrate 100 may be made of any suitable material that is substantially transparent, such as glass. The buffer layer 101 and the gate insulating layer 105 may each be made of any suitable insulating material such as silicon oxide and/or silicon nitride. The interlayer insulating layer 107 may be made of any suitable insulating material such as silicon oxide, silicon nitride, photo acryl and/or benzocyclobutene (BCB). The planarization layer 109 may be made of any suitable insulating layer such as resin. The gate 106 may be made of any suitable conductive material such as Al. The buffer layer 101, the gate 106, the gate insulating layer 105, the interlayer insulating layer 107, and the planarization layer 109 may all be transparent or substantially transparent.

In the disclosed TFT device described above, the function layer 200 may remain on the active layer 104. The function layer 200 may be made of a suitable non-metal material, e.g., silicon oxide and/or silicon nitride. The a-Si layer 102 may be formed by a PECVD process. The processes to form the a-Si layer 102 and the function layer 103, the process to convert the a-Si layer 102 to the p-Si layer 103, and process to pattern the p-Si layer 103 are aforementioned and omitted herein.

In one embodiment, the disclosed TFT device may be a top-gate type TFT device.

Another aspect of the present disclosure provides an array substrate. The array substrate includes the TFTs provided in the present disclosure. For example, the TFTs may be arranged in an array to form an AMLCD (Active-Matrix Liquid Crystal Display) array substrate. A plurality of TFTs may be connected according to a certain arrangement to form a drive circuit, and the TFTs may further be arranged in an array to form an AMOLED (Active-Matrix Organic Light-Emitting Diode) array substrate.

Since TFTs in the array substrates described above are formed by using the embodiments provided in the present disclosure, the array substrates may have improved driver performance. The display quality of the display panels containing the array substrates can be improved.

Another aspect of the present disclosure provides a display apparatus. The display apparatus includes the display substrate provided by the present disclosure.

Based on the structures of the array substrates, the display apparatus may be an LCD display apparatus and/or an OLED display apparatus. For example, the display apparatus can be an LCD panel, an electronic paper, an OLED panel, a mobile phone, a tablet, a TV, a monitor, a laptop, a digital photo frame, a navigator device, and/or any product or component with display functions.

Since the array substrate used in the display apparatus have improved drive performance, the display apparatus may have improved display quality.

It should be understood that the above embodiments disclosed herein are exemplary only and not limiting the scope of this disclosure. Without departing from the spirit and scope of this invention, other modifications, equivalents, or improvements to the disclosed embodiments are obvious to those skilled in the art and are intended to be encompassed within the scope of the present disclosure.

What is claimed is:

1. A method for forming an active layer with a pattern, comprising:
    forming an amorphous silicon layer;
    forming a patterned function layer on the amorphous silicon layer, wherein the patterned function layer has a same pattern as the active layer; and
    performing, after forming the patterned function layer, a crystallizing process for converting the amorphous silicon layer to a poly-silicon layer, wherein the poly-silicon layer has first portions covered by the patterned function layer and second portions not covered by the patterned function layer, and grain sizes of the poly-silicon in the first portions are larger than grain sizes of the poly-silicon in the second portions.

2. The method according to claim 1, wherein the patterned function layer is made of a non-metal material including silicon oxide, silicon nitride, or a combination of silicon oxide and silicon nitride.

3. The method according to claim 1, wherein a thickness of the patterned function layer is about 5 to about 20 nm.

4. The method according to claim 1, further comprising:
    applying a mask for patterning the active layer and patterning a function film to form the patterned function layer with the same pattern as the active layer.

5. The method according to claim 1, wherein crystallizing process includes applying an excimer laser annealing process.

6. The method according to claim 1, further including:
    forming a buffer layer on a substrate, wherein the buffer layer is made of silicon oxide, silicon nitride, or a combination of silicon oxide and silicon nitride.

7. The method according to claim 6, wherein the substrate is made of glass.

8. The method according to claim 1, wherein the amorphous silicon layer and the patterned function layer are formed consecutively by plasma enhanced chemical vapor deposition.

9. The method according to claim 1, wherein the heat retaining duration for the first portions of the amorphous silicon layer covered by the patterned function layer is longer than or equal to 35 ns.

10. The method according to claim 1, wherein the grain sizes of the poly-silicon formed in the first portions covered by the patterned function layer are about 0.3 to 0.5 μm.

11. The method according to claim 1, further comprising:
    removing the patterned function layer after crystallizing the amorphous silicon layer and before patterning the poly-silicon layer.

12. The method according to claim 11, wherein removing the patterned function layer includes applying an etching process to remove the patterned function layer.

* * * * *